US012761244B2

(12) United States Patent
Funk et al.

(10) Patent No.: US 12,761,244 B2
(45) **Date of Patent: *Oct. 13, 2026**

(54) PORTABLE PROBE CARD ASSEMBLY HAVING A PROBE CARD, METHOD FOR ASSEMBLING THE PORTABLE PROBE CARD ASSEMBLY, AND METHOD FOR CLEANING THE PROBE CARD

(71) Applicant: CELADON SYSTEMS, INC., Burnsville, MN (US)

(72) Inventors: William A. Funk, Burnsville, MN (US); Garrett Tranquillo, Burnsville, MN (US); Riley Kaiser, Burnsville, MN (US)

(73) Assignee: CELADON SYSTEMS, INC., Burnsville, MN (US)

( * ) Notice: Subject to any disclaimer, the term of this patent is extended or adjusted under 35 U.S.C. 154(b) by 269 days.

This patent is subject to a terminal disclaimer.

(21) Appl. No.: 18/608,459

(22) Filed: Mar. 18, 2024

(65) Prior Publication Data

US 2024/0219423 A1 Jul. 4, 2024

Related U.S. Application Data

(63) Continuation of application No. 17/441,173, filed as application No. PCT/US2020/023862 on Mar. 20, 2020, now Pat. No. 11,933,816.

(60) Provisional application No. 62/821,211, filed on Mar. 20, 2019.

(51) Int. Cl.
*G01R 1/04* (2006.01)
*G01R 1/073* (2006.01)

(52) U.S. Cl.
CPC ....... *G01R 1/0491* (2013.01); *G01R 1/07342* (2013.01); *G01R 1/07378* (2013.01)

(58) Field of Classification Search
CPC .............. G01R 1/0491; G01R 1/07342; G01R 1/07378
See application file for complete search history.

(56) References Cited

U.S. PATENT DOCUMENTS

| | | | |
|---|---|---|---|
| 5,589,781 A | 12/1996 | Higgins et al. | |
| 6,114,869 A | 9/2000 | Williams et al. | |
| 6,429,644 B1 | 8/2002 | McAllister et al. | |
| 9,568,501 B2 * | 2/2017 | Yamada ............ | G01R 31/2891 |

(Continued)

FOREIGN PATENT DOCUMENTS

| | | | |
|---|---|---|---|
| CN | 1957262 A | 5/2007 | |
| CN | 101002363 A | 7/2007 | |

(Continued)

OTHER PUBLICATIONS

Office Action issued in Chinese Patent Application No. 202080037061.9, issued Apr. 8, 2024, with English translation (17 pages).

(Continued)

*Primary Examiner* — Alvaro E Fortich
(74) *Attorney, Agent, or Firm* — HSML P.C.

(57) ABSTRACT

This disclosure relates generally to test equipment, apparatuses, and systems for a device under test, such as, but not limited to, a semiconductor device. More specifically, this disclosure relates to test equipment, apparatuses, and systems that are portable for use in atypical testing environments.

20 Claims, 14 Drawing Sheets

(56) References Cited

U.S. PATENT DOCUMENTS

| | | | | |
|---|---|---|---|---|
| 2003/0080763 | A1 | 5/2003 | Yu et al. | |
| 2005/0277323 | A1 | 12/2005 | Eldridge et al. | |
| 2006/0049841 | A1 | 3/2006 | Root et al. | |
| 2007/0103178 | A1 | 5/2007 | Kasukabe et al. | |
| 2007/0126435 | A1 | 6/2007 | Eldridge et al. | |
| 2010/0001752 | A1* | 1/2010 | Yamada | G01R 31/2891 324/756.01 |
| 2011/0156735 | A1 | 6/2011 | Breinlinger et al. | |
| 2014/0306729 | A1* | 10/2014 | Chen | G01R 1/07378 324/750.22 |
| 2018/0224481 | A1* | 8/2018 | Kim | G01R 1/07371 |
| 2019/0235018 | A1* | 8/2019 | Dunklee | G01R 31/2874 |

FOREIGN PATENT DOCUMENTS

| | | | |
|---|---|---|---|
| CN | 101140297 | A | 3/2008 |
| CN | 102087333 | A | 6/2011 |
| CN | 102854343 | A | 1/2013 |
| CN | 202886552 | U | 4/2013 |
| CN | 103777129 | A | 5/2014 |
| CN | 103858218 | A | 6/2014 |
| CN | 205301370 | U | 6/2016 |
| CN | 206096201 | U | 4/2017 |
| CN | 106847723 | A | 6/2017 |
| CN | 107132416 | A | 9/2017 |
| CN | 107533100 | A | 1/2018 |
| CN | 108738355 | A | 11/2018 |
| CN | 109425764 | A | 3/2019 |
| JP | H07-35777 | A | 2/1995 |
| KR | 10-2007-0091827 | A | 9/2007 |
| KR | 10-2010-0124913 | A | 11/2010 |
| KR | 10-2012-0104405 | A | 9/2012 |
| TW | 200925612 | A | 6/2009 |
| TW | 200951443 | A | 12/2009 |
| TW | 201027078 | A | 7/2010 |
| TW | 201135253 | A | 10/2011 |
| TW | 201610440 | A | 3/2016 |
| TW | M528428 | U | 9/2016 |

OTHER PUBLICATIONS

Office Action issued in Chinese Patent Application No. 202080037061. 9,, Nov. 13, 2024, with English translation (11 pages).

International Search Report and Written Opinion, International Patent Application No. PCT/US20/23862, Jul. 8, 2020 (8 pages).

* cited by examiner

PORTABLE PROBE CARD ASSEMBLY HAVING A PROBE CARD, METHOD FOR ASSEMBLING THE PORTABLE PROBE CARD ASSEMBLY, AND METHOD FOR CLEANING THE PROBE CARD

FIELD

This disclosure relates generally to test equipment, apparatuses, and systems for a device under test, such as, but not limited to, a semiconductor device. More specifically, this disclosure relates to test equipment, apparatuses, and systems that are portable for use in atypical testing environments.

BACKGROUND

The semiconductor industry continues to have a need to access many electronic devices on a semiconductor wafer. As the semiconductor industry grows and devices become smaller and more complex, many electrical devices, most commonly semiconductor devices and on-wafer electrical interconnects, must be electrically tested, for example, for leakage currents and extremely low operating currents while the devices are in wafer form. In addition, the currents and device characteristics are often required to be evaluated over a wide temperature and voltage range to understand how temperature and voltage affects a device. Also, due to continuous and rapid changes in semiconductor technology, the size of semiconductor devices and their electrical contact pads keeps getting smaller.

To effectively measure semiconductor devices in wafer form, probes are used to contact conductive pads on the surface of the wafer. These probes are, in turn, electrically connected to test instruments. Often, additional electrical interconnection components such as circuit boards make up part of the connection between the probes and test instruments. To minimize degradation of electrical measurements, the probes and interconnection components must be designed to isolate the measurement signal from external electrical interference, leakage currents through dielectric materials, parasitic capacitance, triboelectric noise, piezoelectric noise, and dielectric absorption, etc.

Accordingly, there continues to be a need for improved semiconductor test equipment for electrically probing semiconductor devices, such as semiconductor wafers.

SUMMARY

This disclosure relates generally to test equipment, apparatuses, and systems for a device under test, such as, but not limited to, a semiconductor device. More specifically, this disclosure relates to test equipment, apparatuses, and systems that are portable for use in atypical testing environments.

In an embodiment, a test assembly for testing a device under test includes a base plate including a test site, a top plate, and a probe card. The probe card is secured to the top plate and extends through the top plate to contact a device under test disposed on the test site. The base plate includes a flex ring, pockets disposed in the flex ring, and apertures. The test site is disposed within a perimeter of the flex ring, and the test site is configured to support the device under test. The top plate includes adjustable rigid stops and pins. Fasteners are configured to be insertable through the adjustable rigid stops and align with the apertures, to provide Z positioning and control. The pins are insertable into the pockets, and when inserted, the pins and the pockets provide X and Y control. The flex ring is configured to provide Z positioning and control. The probe card is configured to push the device under test against the base plate.

In an embodiment, the pins are tapered.

In an embodiment, the pins are configured to provide rotational positioning and control.

In an embodiment, the test assembly further comprises a cleaning plate and a cleaning pad.

In an embodiment, the cleaning plate includes a flex ring, the cleaning pad being within a perimeter of the flex ring.

In an embodiment, the cleaning pad includes tungsten carbide.

In an embodiment, the test site includes rigid site stops and a flexible retainer to allow the device under test to be held in place at the test site.

In an embodiment, the base plate includes a pads configured to receive the adjustable rigid stops.

In an embodiment, the top plate includes an adjustable lock configured to secure the rigid stops a desired location in a Z position.

In an embodiment, a method of assembling a test assembly for a device under test includes assembling the test assembly above by installing the top plate including a probe card onto the base plate, and tightening fasteners to secure the test assembly.

BRIEF DESCRIPTION OF THE DRAWINGS

References are made to the accompanying drawings that form a part of this disclosure, and which illustrate embodiments in which the systems and methods described in this specification can be practiced.

Like reference numbers represent like parts throughout.

DETAILED DESCRIPTION

This disclosure relates generally to test equipment, apparatuses, and systems for a device under test, such as, but not limited to, a semiconductor device. More specifically, this disclosure relates to test equipment, apparatuses, and systems that are portable for use in atypical testing environments.

The test equipment and systems described herein may be especially suited for testing of a device under test that includes an atypical testing environment. In an embodiment, an atypical testing environment can include, but is not limited to, application of extreme temperatures (e.g., cold such as in a cryostat; heat such as in an oven; or the like); application of radiation; application of pressure; or the like.

In an embodiment, the test equipment and systems described herein may be portable so that the test equipment and assemblies can be placed into the atypical testing environment and used to test devices (e.g., chips) directly in the atypical testing environment instead of while on the semiconductor wafer.

In an embodiment, the test equipment and systems describe herein are portable, where both the probe and its mount or plate as well as the mount or plate of the device under test have motion control in the X, Y, and Z directions, as well as Θ, in contrast to many current equipment and systems where both the probe and the device under test can move, requiring a significant amount of overhead in additional equipment to control or limit the motion. The test equipment and systems describe herein are portable in that the mounting features provide motion control in a compact set of equipment. The test equipment and systems describe herein are portable and can allow for a kinematic and flexible assembly with repeatable alignment for multiple tests and for example multiple tests in an atypical testing environment.

A probe card can mate with a base plate with at or about 10 micron repeatability. In an embodiment, this can be accomplished with a plurality of adjustable rigid stops for overdrive and planarity. In an embodiment, three adjustable rigid stops are shown. In an embodiment, the adjustable hard stops provide Z positioning and control. In an embodiment, a plurality of tapered towels may fit into holes in a flex plate and are used to provide X & Y positioning and control. In an embodiment, the tapered towel pins can provide rotational or Θ positioning and control. In an embodiment, two tapered dowels may be employed such as for example as shown in the following Figures.

A device under test (e.g., a chip) can be held in a base plate with a spring clip pushing the chip against hard stops. Probe tips of the probe card will push the chip tight against the base plate. There can be temperature sensors on the probe card and the base plate. Three screws can hold the probe card to the base plate. A tungsten carbide cleaning plate can inserted between the base plate and the probe card.

Figure 1:
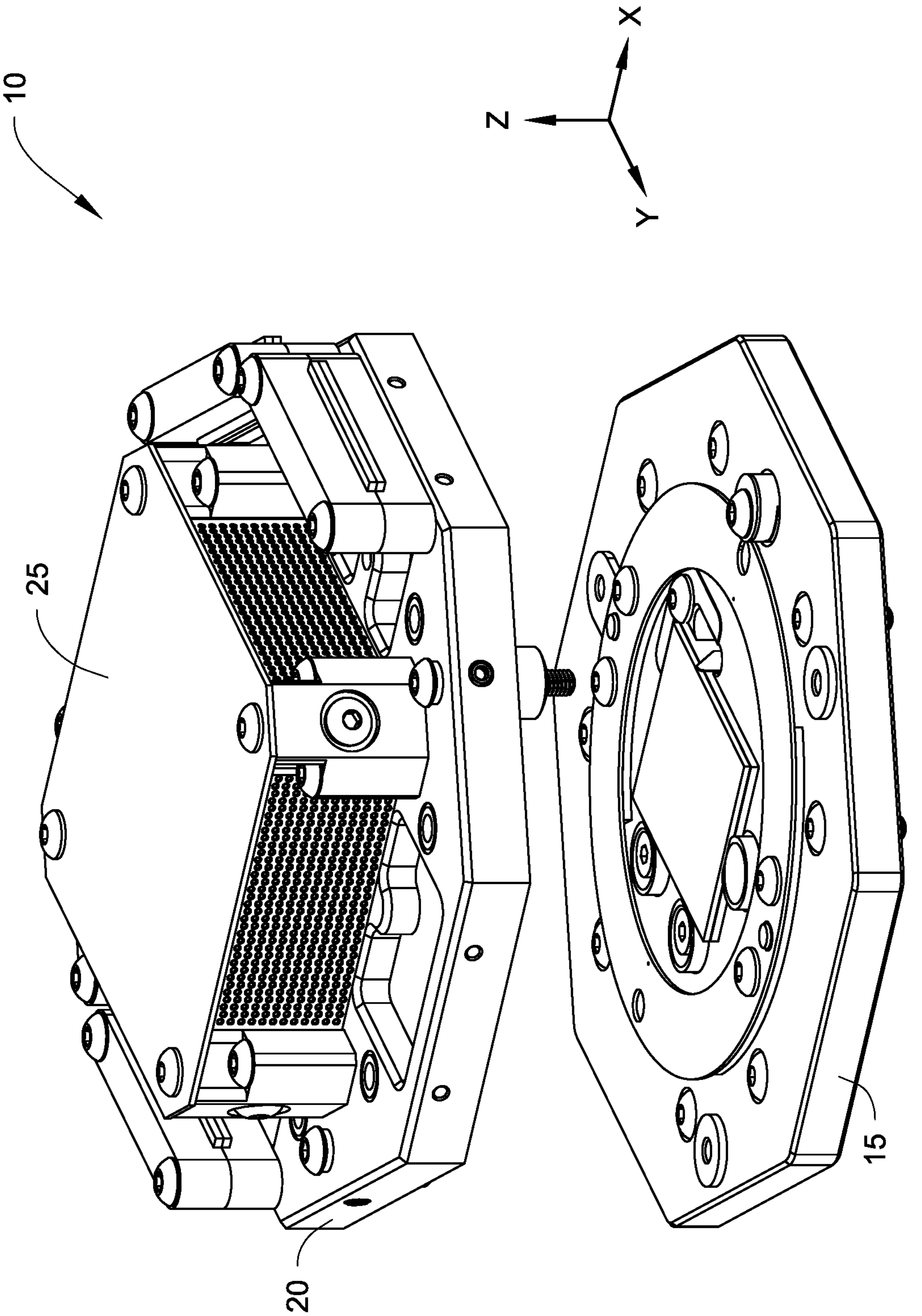
FIG. 1 illustrates a top perspective view of a probe card assembly, according to an embodiment.

FIG. 1 illustrates a top perspective view of a probe card assembly 10, according to an embodiment. The probe card assembly 10 includes a base plate 15, a top plate 20, and a probe card 25 secured to the top plate 20. The base plate 15 can be secured into the appropriate testing environment. For example, the base plate 15 can be installed into a cryostat, an oven, or the like, according to a desired testing environment. For illustrative purposes, FIG. 1 includes X, Y, and Z axes to be indicative of the X, Y, and Z-directions.

Figure 2:
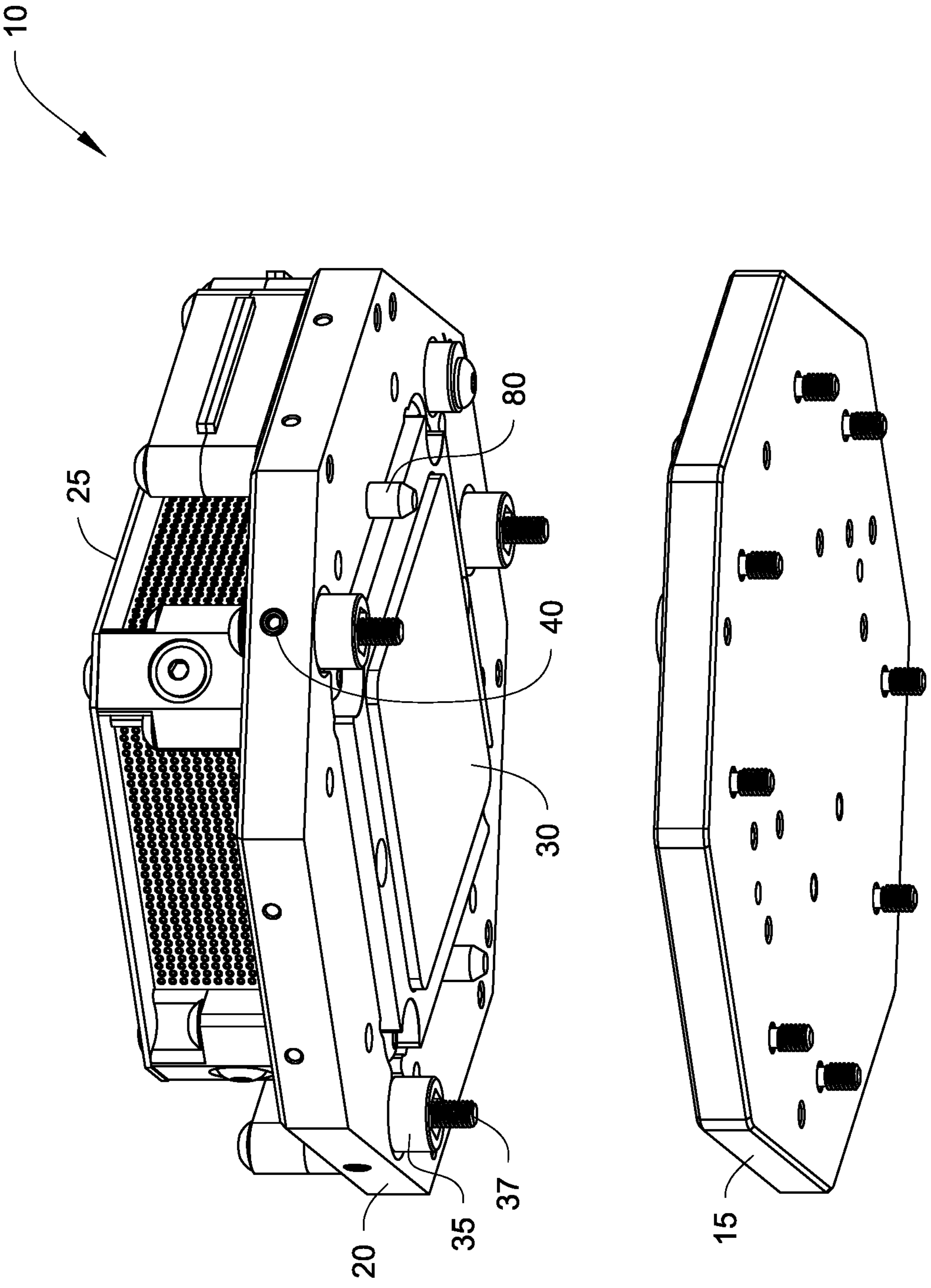
FIG. 2 illustrates a bottom perspective view of the probe card assembly of FIG. 1, according to an embodiment.

FIG. 2 illustrates a bottom perspective view of the probe card assembly 10 of FIG. 1, according to an embodiment. A center portion 30 of the probe card 25 is adjustable to allow precise alignment of the probe card 25 with the device under test. The device under test can be placed on the base plate 15 at a test site 55 (FIG. 4) as shown and described in accordance with FIG. 4 below. A plurality of rigid stops 35 protrude from a surface of the top plate 20 (toward the base plate 15). In the illustrated embodiment, a fastener (e.g., a screw or the like) 37 protrudes from the rigid stops 35. An adjustable lock 40 (e.g., a lock screw) can secure the rigid stops 35 in a desired location. For example, the adjustable lock 40 allows for adjusting and securing of the rigid stops in the Z direction.

Figure 3:
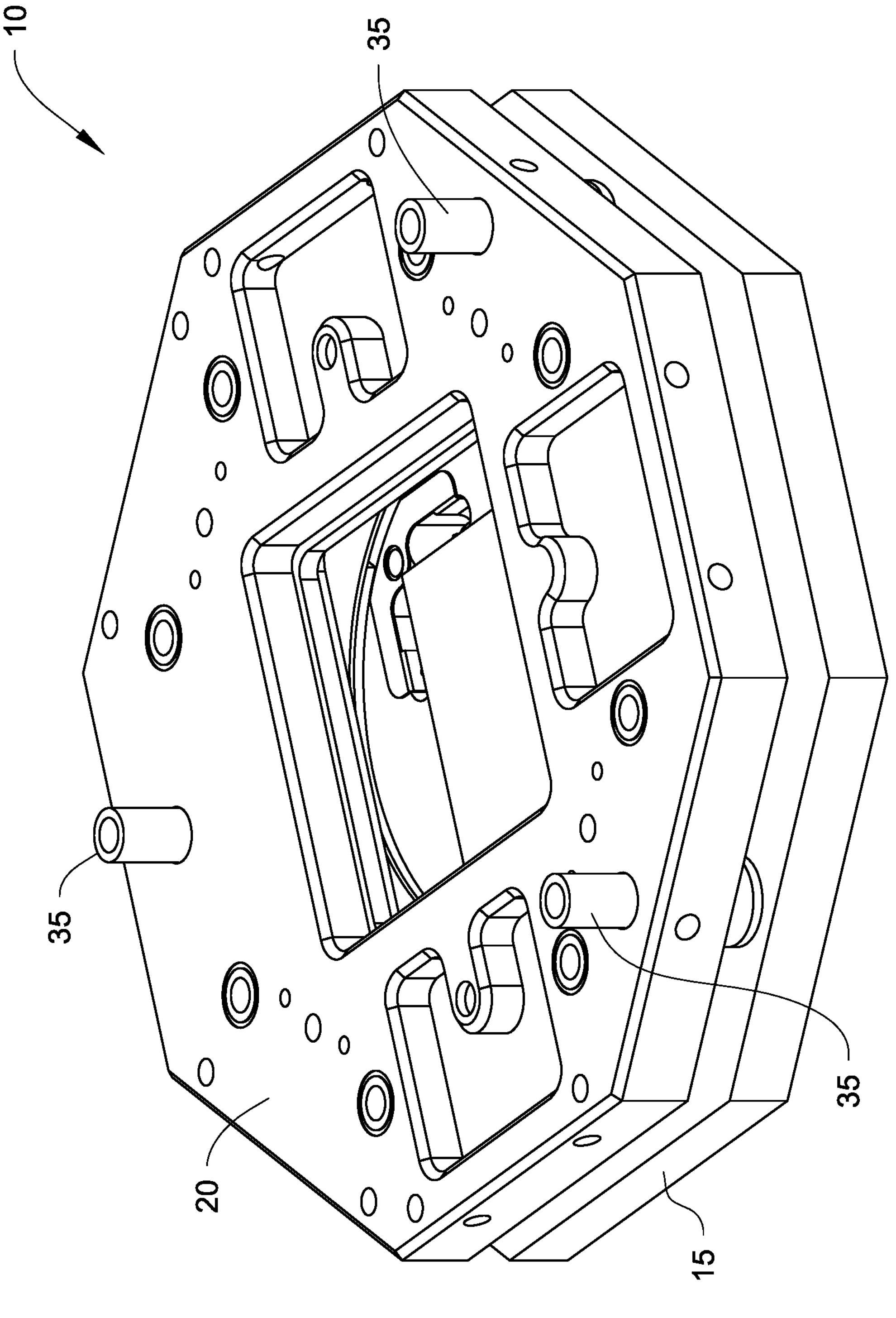
FIG. 3 illustrates a top perspective view of the probe card assembly of FIG. 1 with the probe card removed, according to an embodiment.

FIG. 3 illustrates a top perspective view of the probe card assembly 10 of FIG. 1 with the probe card 25 removed, according to an embodiment. In the illustrated embodiment, the base plate 15 and the top plate 20 are octagonal in geometry. In an embodiment, a thickness of the base plate 15 can be at or about 0.25 inches thick. In an embodiment, a thickness of the top plate can be at or about 0.3125 inches thick. It is to be appreciated that these thicknesses are examples and the actual thickness can vary beyond the stated values in accordance with the principles of this Specification.

Figure 4:
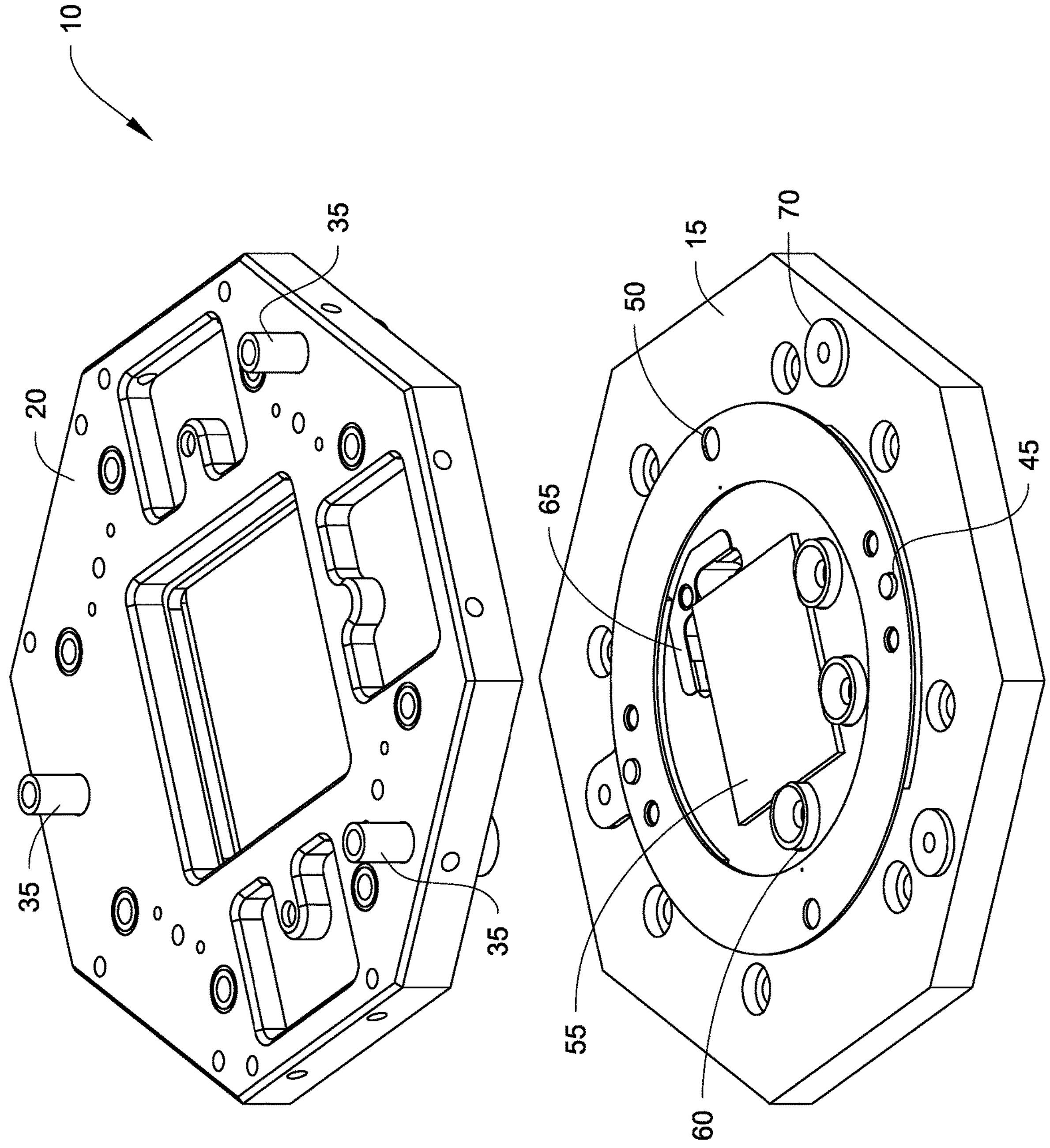
FIG. 4 illustrates a top perspective view of the probe card assembly of FIG. 1 with the probe card removed, according to an embodiment.

FIG. 4 illustrates a top perspective view of the probe card assembly 10 of FIG. 1 with the probe card 25 removed, according to an embodiment. In the illustrated embodiment, the top plate 20 includes three adjustable rigid stops 35. A fastener (e.g., the fastener 37 in FIG. 2) such as, but not limited to, a screw, can be inserted into the rigid stops 35. The adjustment can, for example, control an overdrive of electrical contacts in the probe card assembly 10. A flex ring 45 is secured to the base plate 15. The flex ring 45 can be secured with, for example, screws, pins, suitable combinations thereof, or the like. The flex ring 45 includes pockets 50 for receiving a pin of the top plate 20 when assembled. In an embodiment, the pockets 50 may be holes into which the pins 80 may be inserted. In an embodiment, the pins 80 may be tapered pins or dowels, having a chamfered or tapered surface. The pins 80 allow loading of the top plate 20 on top of the base plate 15 and flex ring 45, and then to move past the surface to help limit or control X, Y, and/or Θ movement.

A device under test can be held in place at a test site 55 via a plurality of rigid site stops 60 and a flexible retainer 65 (e.g., a spring clip or the like).

In an embodiment, the base plate 15 also includes a plurality of pads 70 for receiving the plurality of adjustable rigid stops 35. Accordingly, the number of pads 70 and the number of adjustable rigid stops 35 can be the same.

Figure 5:
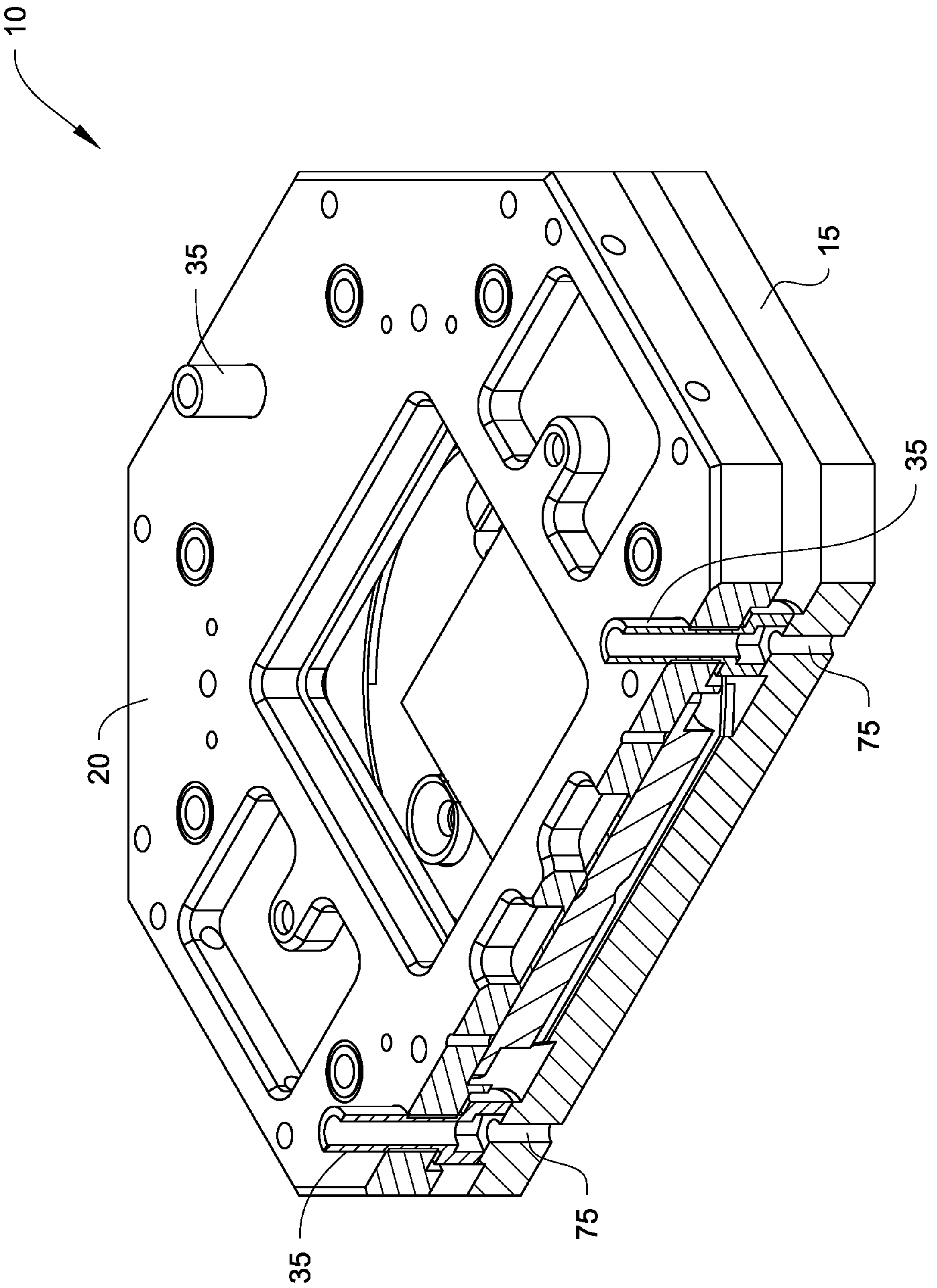
FIG. 5 illustrates a sectional view of the probe card assembly of FIG. 1 with the probe card removed, according to an embodiment.

FIG. 5 illustrates a sectional view of the probe card assembly 10 of FIG. 1 with the probe card 25 removed, according to an embodiment. In the illustrated embodiment, apertures 75 are shown in the base plate 15 which align with the fasteners 37 extending through the adjustable rigid stops 35. In an embodiment, the apertures 75 are threaded to securely receive the fasteners 37.

Figure 6:
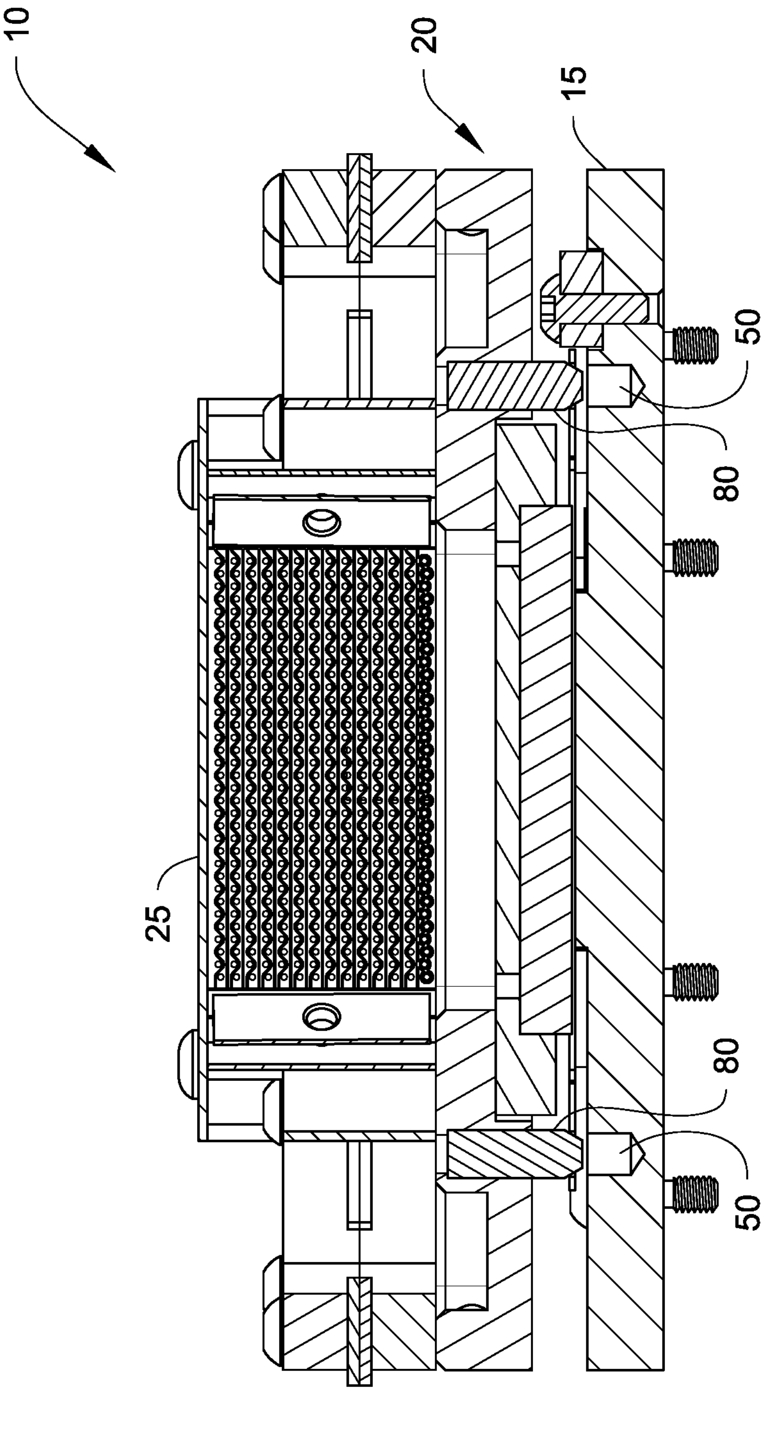
FIG. 6 illustrates a side view of the probe card assembly of FIG. 1, according to an embodiment.

FIG. 6 illustrates a side view of the probe card assembly 10 of FIG. 1, according to an embodiment. Two tapered pins 80 from the top plate 20 nest into the pockets 50 (e.g., holes) in the flex ring 45 attached to the base plate 15. When assembling the probe card assembly, the pins 80 can establish an X-Y location. In an embodiment, when the pins 80 are inserted into the pockets 50, the top plate having the probe is controlled from moving in Θ (e.g. rotationally) with respect to the base plate 15. The flex ring 45 may deform (e.g., bend) until the rigid stops 35 bottom out and help to define the Z location.

Figure 7:
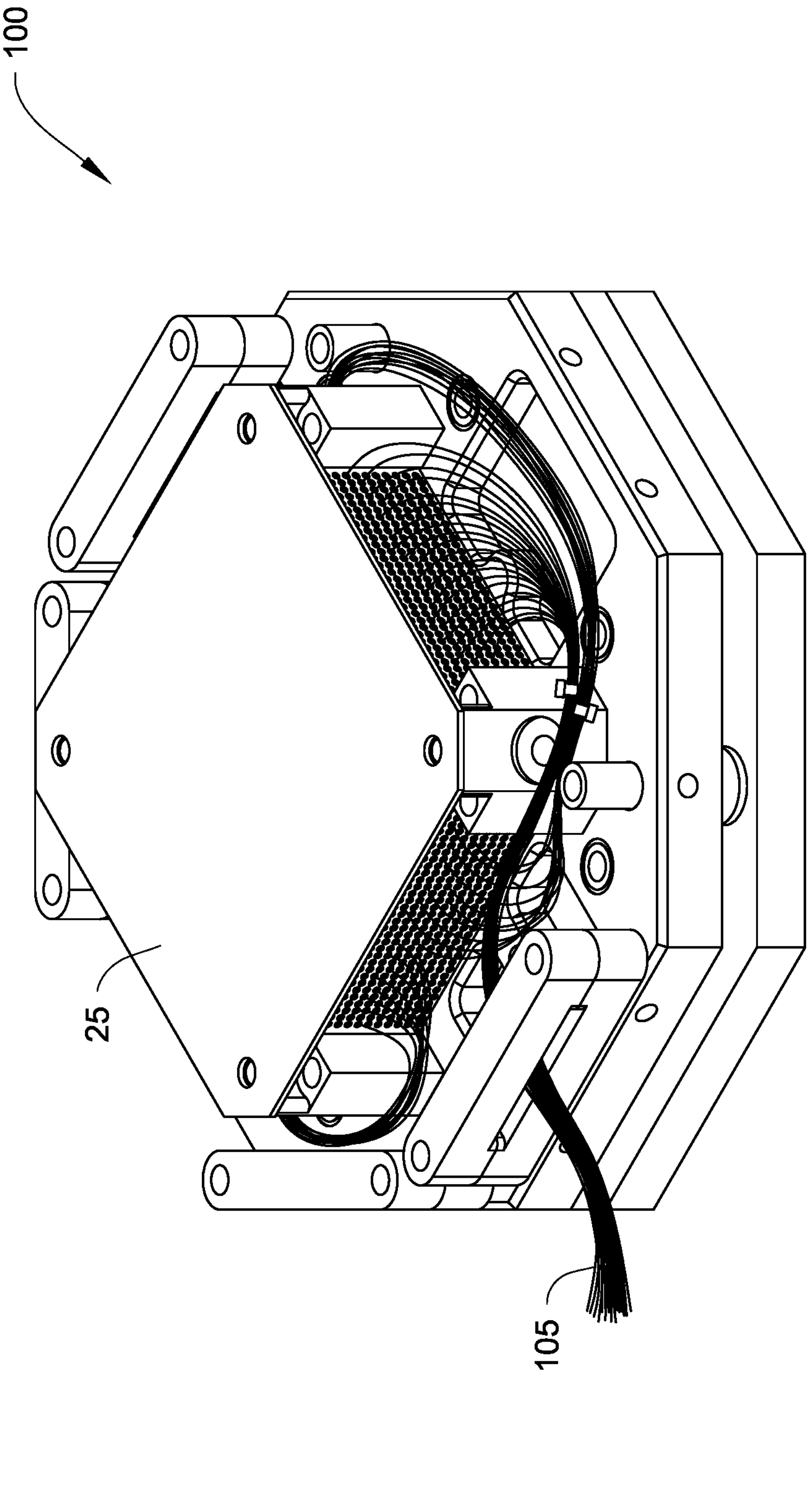
FIG. 7 illustrates a top perspective view of a probe card assembly, according to an embodiment.

FIG. 7 illustrates a top perspective view of a probe card assembly 100, according to an embodiment. The probe card assembly 100 may be the same as or similar to the probe card assembly 10. The probe card assembly 100 in the illustrated embodiment includes a plurality of wires 105 electrically connected to the probe card 25 and capable of being electrically connected to test equipment (not shown).

Figure 8A:
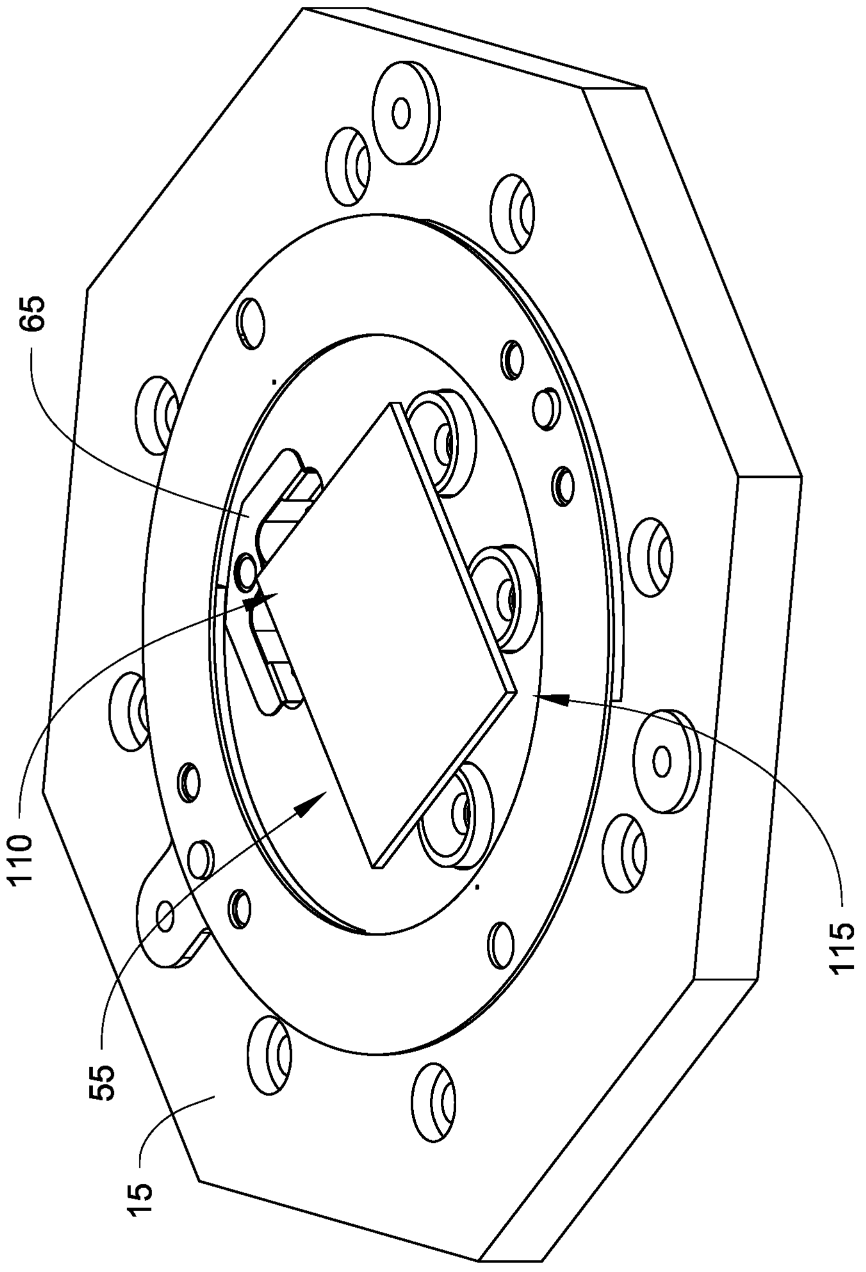
FIGS. 8A and 8B illustrate a top view of the bottom plate of the probe card assembly of FIG. 7, according to an embodiment.
Figure 8B:
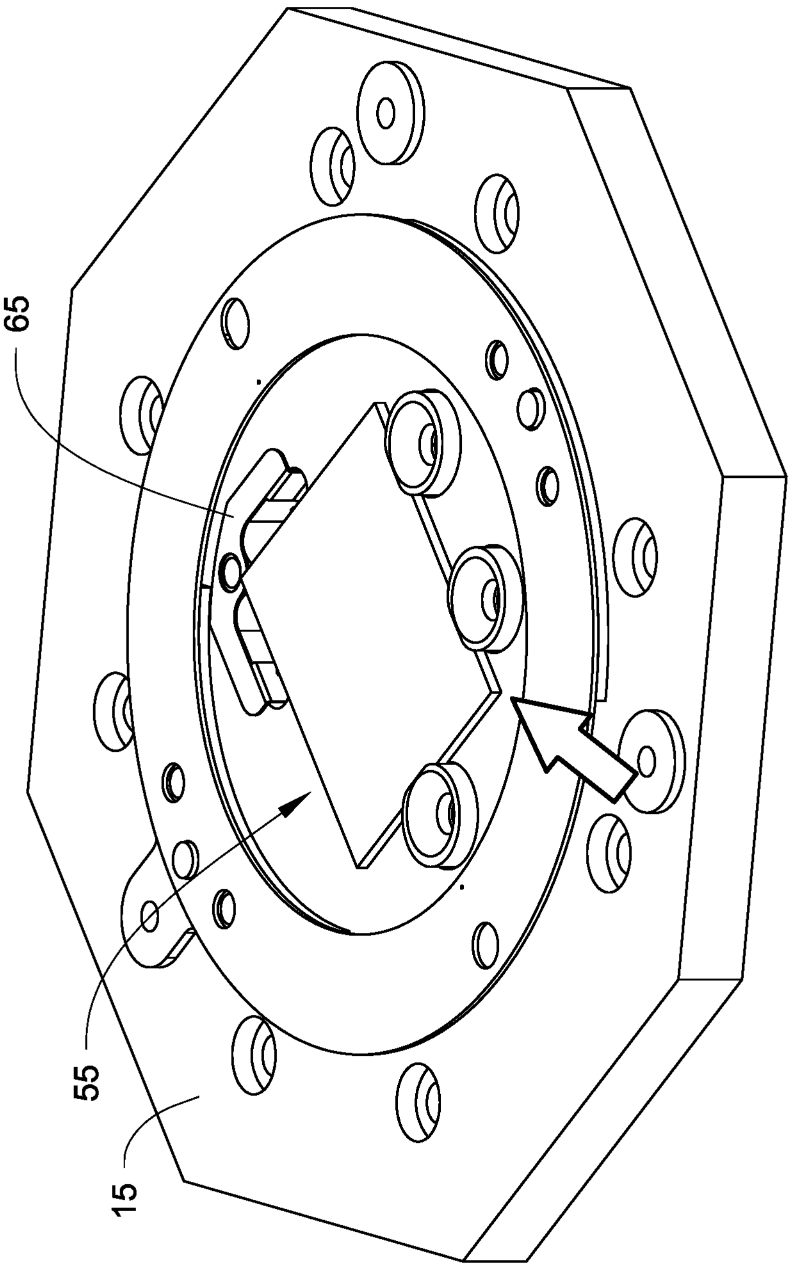

FIGS. 8A and 8B illustrate a top view of the bottom plate 15 of the probe card assembly 100 of FIG. 7, according to an embodiment. The base plate 15 can be secured in the testing environment (e.g., cryostat, oven, or the like, not shown in FIGS. 8A and 8B). When placing the device under test onto the test site 55 for testing, the device under test can be inserted with a corner 110 near the flexible retainer 65 on a surface of the base plate 15 (FIG. 8A). The opposite corner 115 of the device under test can rest on top of the rigid stops 60. The device under test can then be gently pushed at the corner 115 toward the flexible retainer 65 (e.g., in the direction of the block arrow in FIG. 8B) and down (toward the base plate 15) until the device under test rests on the test site 55.

Figure 9A:
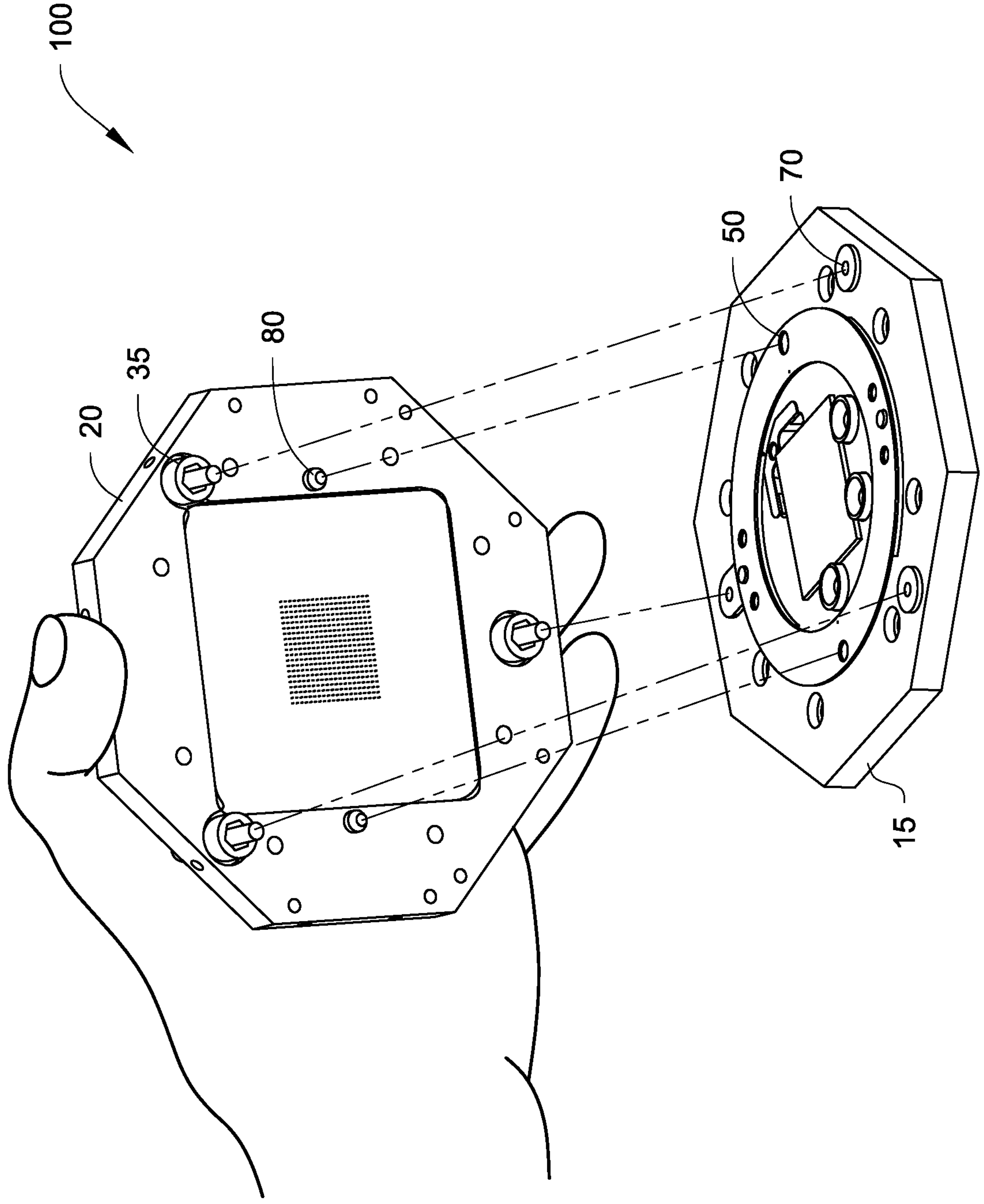
FIGS. 9A and 9B illustrate a method of assembling the probe card assembly of FIG. 7, according to an embodiment.
Figure 9B:
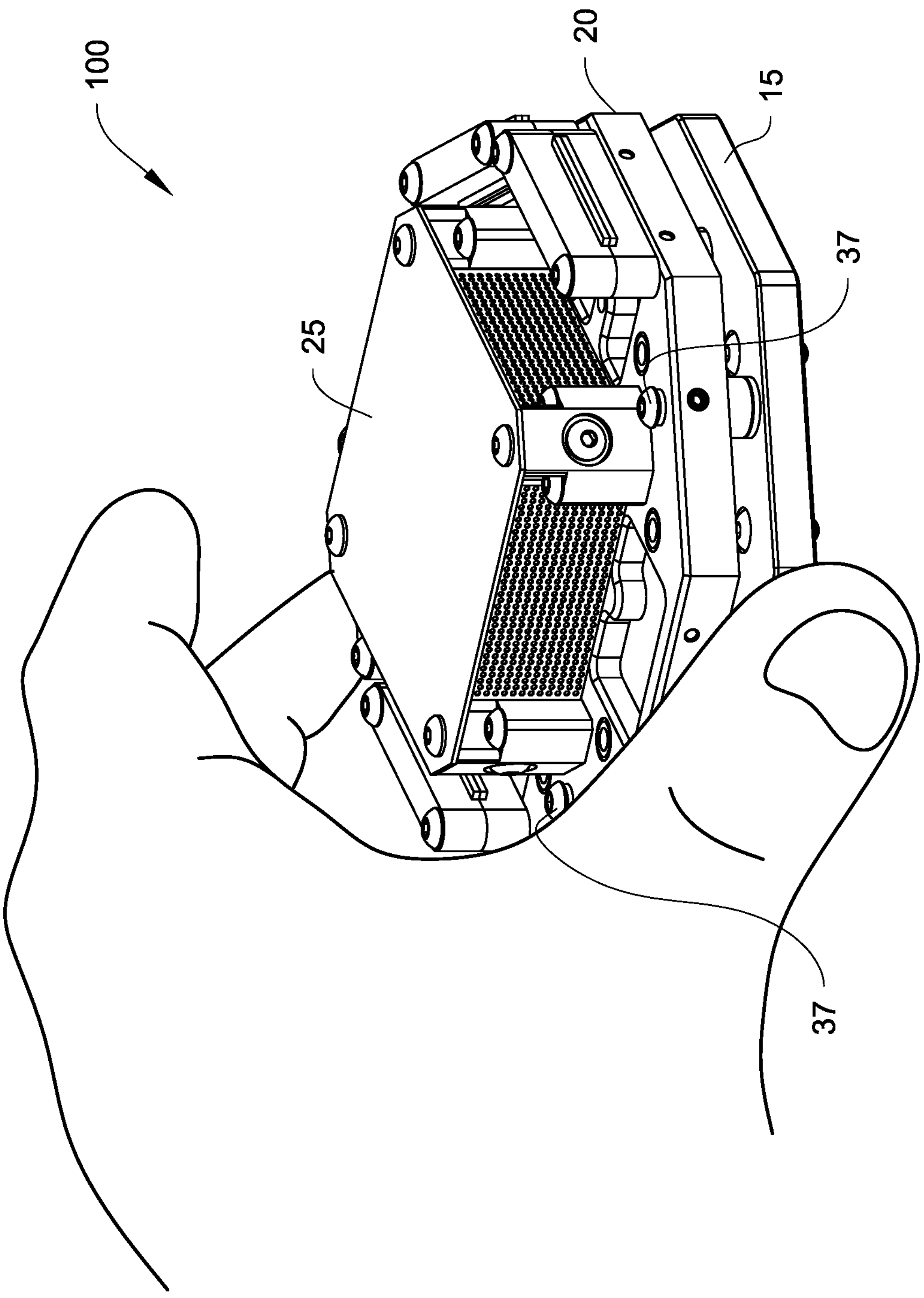

FIGS. 9A and 9B illustrate a method of assembling the probe card assembly 100 of FIG. 7, according to an embodiment. The arrows (FIG. 9A) represent a direction of installing the top plate 20 onto the base plate 15. Once placed (FIG. 9B), fasteners 37 can be tightened to secure the probe card assembly 100.

Figure 10A:
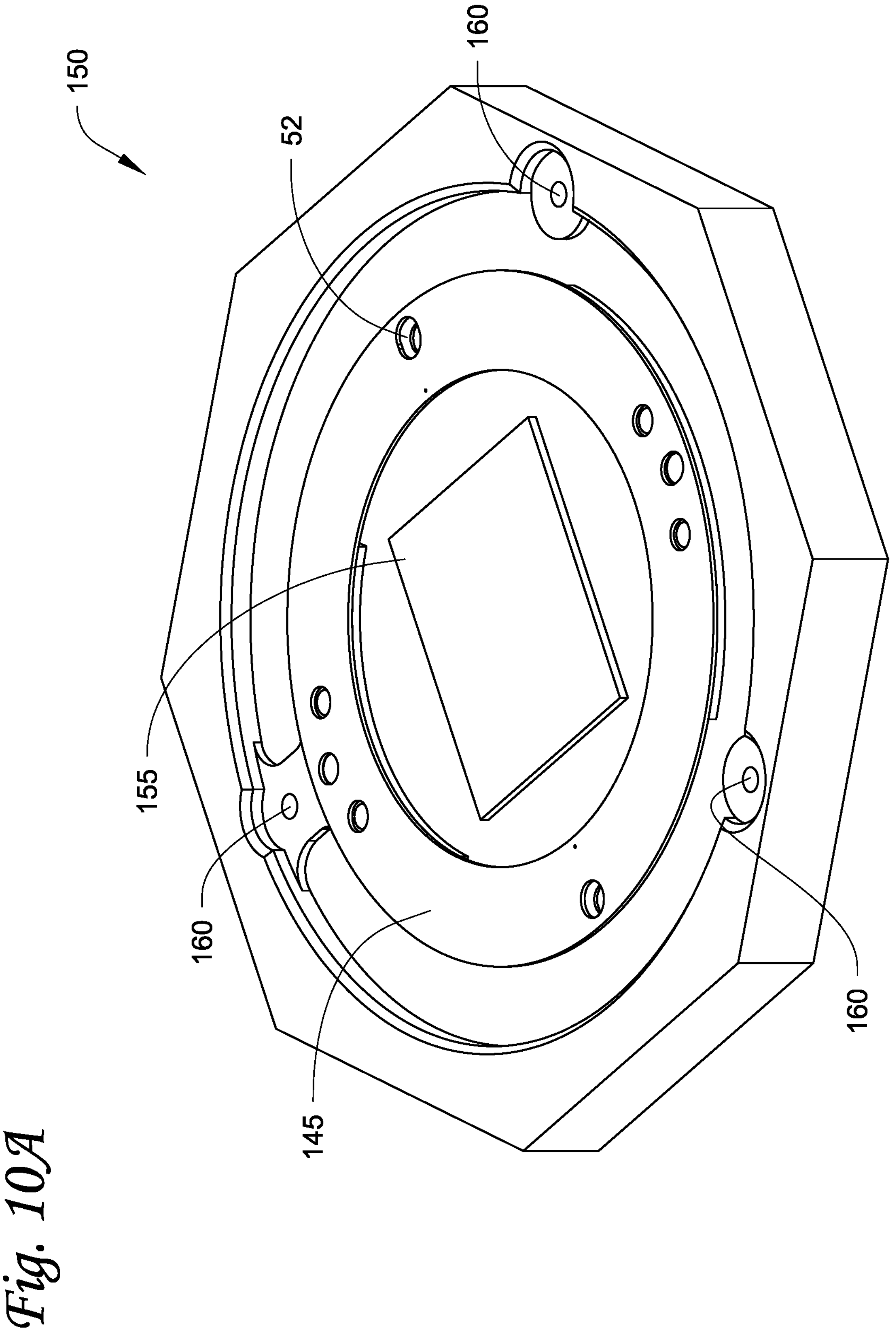
FIGS. 10A and 10B illustrate a cleaning plate which in an embodiment can be used for the probe card assembly of FIG. 7, according to an embodiment.
Figure 10B:
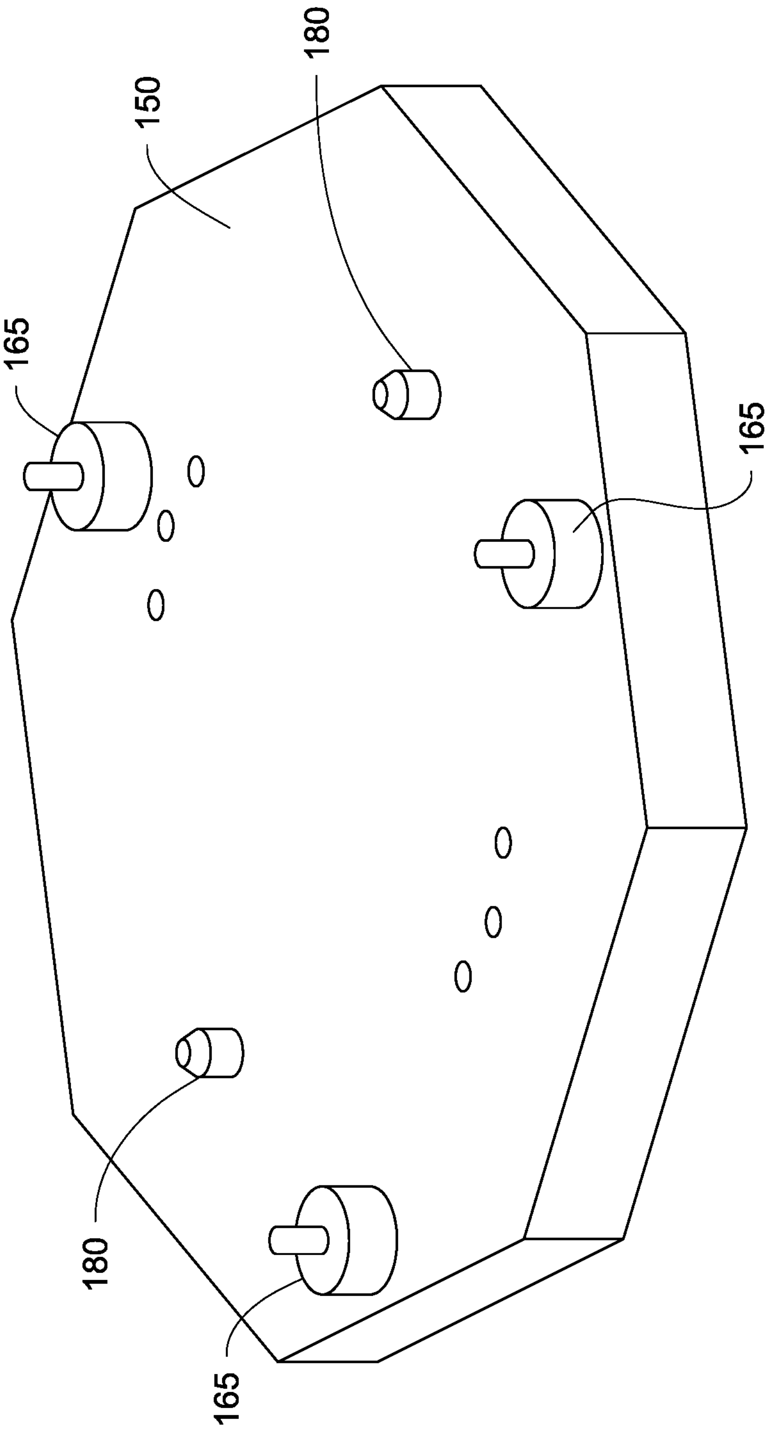

FIGS. 10A and 10B illustrate a cleaning plate 150 installed in the probe card assembly 100 of FIG. 7, according to an embodiment. FIG. 10A shows a top view of the cleaning plate 150 and FIG. 10B shows a bottom view of the cleaning plate 150. Referring to FIG. 10A, the cleaning plate 150 includes a cleaning pad 155 that is disposed to align with probe tips of the probe card 25. The cleaning pad 155 can be made of a material utilized to clean the probe tips. In an embodiment, the material can be a tungsten carbide material. In an embodiment, the material is textured tungsten carbide. Three hard stops 160 can accommodate a thickness variation of the cleaning plate 150. In an embodiment, the hard stops 155 can be adjustable, but fixed into a particular location at a time of manufacturing. As shown in FIG. 10B, three pins 165 fit into apertures in the base plate 15 (not shown in FIGS. 10A, 10B). Tungsten carbide plate bonded to cleaning plate. Once the cleaning plate 150 is in place, the probe card 25 is installed the same as it is to the base plate 15 (as discussed above). The probes of the probe card can scrub against the cleaning pad 155 to remove debris from the probes.

In an embodiment, the cleaning plate 150 includes pins 180 as shown in FIG. 10B, which may be tapered pins (as shown), and can be used to assemble the bottom of the cleaning plate 150 to the base plate 15. For example, the pins 180 can be inserted into pockets 50 of the base plate 15. Likewise, the cleaning plate 150 includes pockets 52 similar to pockets 50 of the base plate for receiving the pins 80 of the top plate 20. In an embodiment, the cleaning plate 150 can also have a flex ring 145 in which pockets 52 are arranged.

Figure 10C:
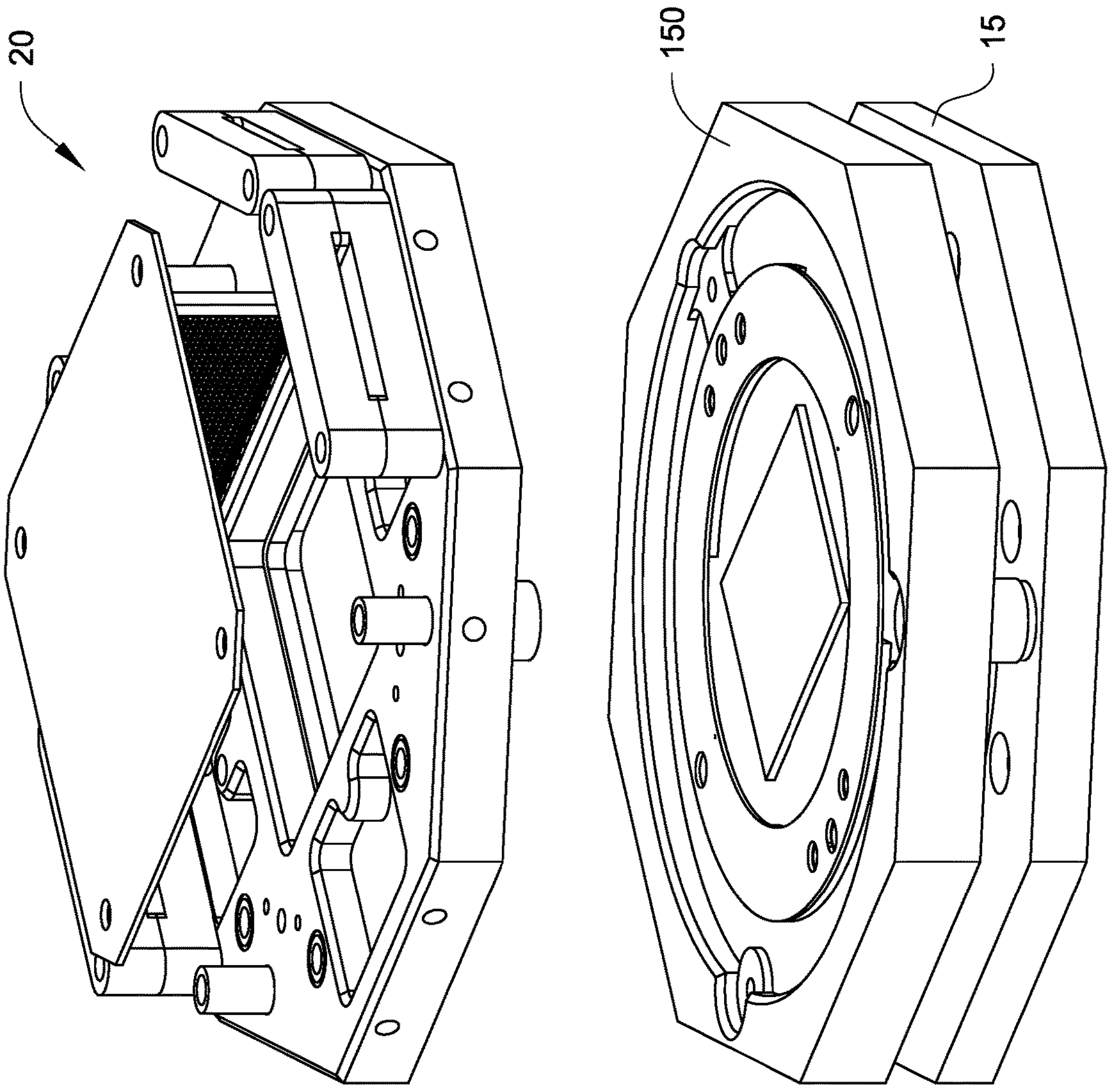
FIG. 10C illustrates the cleaning plate of FIGS. 10A and 10B installed in the probe card assembly of FIG. 7, according to an embodiment.

FIG. 10C illustrates the cleaning plate of FIGS. 10A and 10B installed in the probe card assembly of FIG. 7, according to an embodiment. As shown, cleaning plate 150 is assembled in between the top plate 20 (with the probe card) and the bottom plate 15.

It will be appreciated in some embodiments, the base plate 15 is not required for use of the cleaning plate 150. In such circumstance, in an embodiment, the cleaning plate 150 can still receive the pins 80 of the top plate through pockets 52 on the cleaning plate 150. However, on the bottom of the cleaning plate, there are no pins 165 or pins 180 since there would not be a need to assemble the cleaning plate 150 with the base plate 15. That is, for example, the bottom of the cleaning plate 150 may be flat without pins 165 or 180.

Semiconductor Device Not Limitative

The present disclosure is particularly suitable for probing semiconductor devices, but the use of the present teachings is not limited to probing semiconductor devices. Other devices may be applied to the present invention teachings. Thus, while this specification speaks in terms of probing "semiconductor" devices, this term should be interpreted broadly to include probing any suitable device.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A test assembly for testing a device under test, comprising:

a base plate including a test site;

a top plate; and a probe card, the probe card secured to the top plate and extending through the top plate, the probe card being configured to contact the device under test disposed on the test site, wherein the base plate includes a flexible member and one or more pockets disposed in the flexible member, the test site is disposed within a perimeter of the flexible member, and the test site is configured to support the device under test, and the flexible member is configured to provide Z positioning and control.

2. The test assembly of claim 1, further comprising a cleaning plate and a cleaning pad.

3. The test assembly of claim 2, wherein the cleaning plate includes a flexible member, the cleaning pad being within a perimeter of the flexible member of the cleaning plate.

4. The test assembly of claim 2, wherein the cleaning pad includes tungsten carbide.

5. The test assembly of claim 1, wherein the flexible member is a flex ring.

6. The test assembly of claim 1, wherein the base plate comprises one or more apertures.

7. The test assembly of claim 6, wherein fasteners are configured to align with the one or more apertures to provide Z positioning and control.

8. The test assembly of claim 1, wherein the top plate includes adjustable rigid stops and pins, and fasteners are configured to be insertable through the adjustable rigid stops to provide Z positioning and control.

9. The test assembly of claim 8, wherein the pins are insertable into the one or more pockets and, when inserted, the pins and the one or more pockets provide X and Y control.

10. The test assembly of claim 8, wherein the pins are tapered.

11. The test assembly of claim 8, wherein the pins are configured to provide rotational positioning and control.

12. The test assembly of claim 8, wherein the base plate includes pads configured to receive the adjustable rigid stops.

13. The test assembly of claim 8, wherein the top plate includes an adjustable lock configured to secure the adjustable rigid stops at a desired location in a Z position.

14. The test assembly of claim 1, wherein the probe card is configured to push the device under test against the base plate.

15. The test assembly of claim 1, wherein the test site includes rigid site stops and a flexible retainer configured to allow the device under test to be held in place at the test site.

16. A method of assembling a test assembly, the method comprising:

installing a probe card onto a top plate;

installing the top plate including the probe card onto a base plate;

supporting a device under test on a test site that is disposed within a perimeter of a flexible member of the base plate;

inserting fasteners through adjustable rigid stops included in the top plate and aligning the fasteners with one or more apertures in the flexible member of the base plate, to provide Z positioning and control; and tightening fasteners to secure the test assembly having the top plate and the base plate.

17. The method of claim 16, further comprising:

inserting pins included in the top plate into pockets in the flexible member of the base plate and, when inserted, the pins and the pockets provide X and Y control.

18. The method of claim 17, wherein the inserting of the pins includes inserting the pins, that are tapered, into the pockets; and when inserted, the pins are configured to provide rotational positioning and control.

19. The method of claim 16, further comprising:

pushing the device under test against the base plate with the probe card.

20. A method for cleaning a probe tip of a probe card, the method comprising:

inserting fasteners through adjustable rigid stops included in a top plate and aligning the fasteners with one or more apertures in a cleaning plate, to provide Z positioning and control;

installing the top plate onto the cleaning plate;

installing the probe card onto the top plate;

tightening the fasteners to secure a cleaning assembly having the top plate and the cleaning plate;

pushing the probe card against the cleaning plate; and scrubbing the probe tip of the probe card against the cleaning plate.

* * * * *